(12) United States Patent
Erhart et al.

(10) Patent No.: US 8,922,192 B2
(45) Date of Patent: Dec. 30, 2014

(54) MULTIPHASE ELECTRICAL POWER PHASE IDENTIFICATION

(75) Inventors: David Erhart, San Mateo, CA (US); Craig Southeren, Erina (AU); Stacey Reineccius, San Francisco, CA (US)

(73) Assignee: Stem, Inc., Millbrae, CA (US)

(*) Notice: Subject to any disclaimer, the term of this patent is extended or adjusted under 35 U.S.C. 154(b) by 537 days.

(21) Appl. No.: 13/340,860

(22) Filed: Dec. 30, 2011
(Under 37 CFR 1.47)

(65) Prior Publication Data
US 2013/0141075 A1    Jun. 6, 2013

(51) Int. Cl.
| | | |
|---|---|---|
| *G01R 19/00* | (2006.01) | |
| *G01R 25/00* | (2006.01) | |
| *H02J 13/00* | (2006.01) | |
| *H02J 3/26* | (2006.01) | |
| *G01R 31/02* | (2006.01) | |
| *G01R 29/18* | (2006.01) | |

(52) U.S. Cl.
CPC .................. *G01R 29/18* (2013.01); *H02J 13/00* (2013.01); *Y02E 40/50* (2013.01); *H02J 3/26* (2013.01); *G01R 31/023* (2013.01)
USPC .............................................. 324/66; 324/86

(58) Field of Classification Search
CPC ..... G01R 29/18; G01R 31/023; G01R 31/021
USPC ..................................................... 324/66, 86
See application file for complete search history.

(56) References Cited

U.S. PATENT DOCUMENTS

| | | | |
|---|---|---|---|
| 3,487,289 A | 12/1969 | McMurray | |
| 4,121,147 A | 10/1978 | Becker et al. | |
| 4,287,465 A | 9/1981 | Godard et al. | |
| 4,399,396 A | 8/1983 | Hase | |
| 4,559,590 A | 12/1985 | Davidson | |
| 4,752,697 A | 6/1988 | Lyons et al. | |
| 4,847,745 A | 7/1989 | Shekhawat et al. | |

(Continued)

FOREIGN PATENT DOCUMENTS

| | | |
|---|---|---|
| EP | 2101403 A2 | 9/2009 |
| EP | 2 204 658 A1 | 7/2010 |

(Continued)

OTHER PUBLICATIONS

Cha et al. "A New Soft Switching Direct Converter for Residential Fuel Cell Power System", IAS 2004. 2:1172-1177.

(Continued)

*Primary Examiner* — Amy He
(74) *Attorney, Agent, or Firm* — Patterson & Sheridan LLP

(57) ABSTRACT

A method for multiphase electrical power phase identification by a monitoring component includes: receiving a request for the power phase identification for a given power component phase connection from a power component; in response, sending signal characteristics to the power component; monitoring power signals on distribution panel phase connections; determining that the signal characteristics are found on a given distribution panel phase connection; and in response, sending an identifier of the given distribution panel phase connection to the power component. In receiving the signal characteristics, the power component: selects the given power component phase connection; applies a signal with the signal characteristic on the given power component phase connection; receives an identifier of the given distribution panel phase connection from the monitoring component; and associates the identifier with the given power component phase connection.

20 Claims, 7 Drawing Sheets

(56) References Cited

U.S. PATENT DOCUMENTS

| | | |
|---|---|---|
| 4,996,637 A | 2/1991 | Piechnick |
| 5,262,931 A | 11/1993 | Vingsbo |
| 5,274,571 A | 12/1993 | Hesse et al. |
| 5,369,353 A | 11/1994 | Erdman |
| 5,510,700 A | 4/1996 | Pomatto |
| 5,594,318 A | 1/1997 | Nor et al. |
| 5,595,506 A | 1/1997 | Robinson et al. |
| 5,620,337 A | 4/1997 | Pruehs |
| 5,909,367 A | 6/1999 | Change |
| 6,015,314 A | 1/2000 | Benfante |
| 6,018,203 A | 1/2000 | David et al. |
| 6,059,605 A | 5/2000 | Robinson et al. |
| 6,160,722 A | 12/2000 | Thommes et al. |
| 6,172,480 B1 | 1/2001 | Vandelac |
| 6,200,158 B1 | 3/2001 | Robinson |
| 6,268,715 B1 | 7/2001 | Oglesbee et al. |
| 6,301,132 B1 | 10/2001 | Vandelac |
| 6,310,789 B1 | 10/2001 | Nebrigic et al. |
| 6,388,421 B2 | 5/2002 | Abe |
| 6,404,655 B1 | 6/2002 | Welches |
| 6,420,801 B1 | 7/2002 | Seefeldt |
| 6,424,119 B1 | 7/2002 | Nelson et al. |
| 6,429,625 B1 | 8/2002 | LeFevre et al. |
| 6,522,031 B2 | 2/2003 | Provanzana et al. |
| 6,587,362 B1 | 7/2003 | Vithayathil |
| 6,606,552 B2 | 8/2003 | Haimerl et al. |
| 6,639,383 B2 | 10/2003 | Hoff et al. |
| 6,750,685 B1 | 6/2004 | Guerrero Mercado |
| 7,019,666 B2 | 3/2006 | Tootoonian Mashhad et al. |
| 7,031,859 B2 | 4/2006 | Piesinger |
| 7,141,960 B2 * | 11/2006 | Bystrom ................. 324/66 |
| 7,157,810 B2 | 1/2007 | Kanouda et al. |
| 7,199,527 B2 | 4/2007 | Holman |
| 7,248,490 B2 | 7/2007 | Olsen et al. |
| 7,262,694 B2 | 8/2007 | Olsen et al. |
| 7,385,373 B2 | 6/2008 | Doruk et al. |
| 7,456,519 B2 | 11/2008 | Takeda et al. |
| 7,676,334 B2 | 3/2010 | Matsuura et al. |
| 7,747,739 B2 | 6/2010 | Bridges et al. |
| 7,752,145 B2 | 7/2010 | Kelty |
| 7,804,183 B2 | 9/2010 | Arinaga |
| 7,933,695 B2 | 4/2011 | Yamaguchi |
| 8,053,921 B2 | 11/2011 | Ichikawa |
| 8,125,183 B2 | 2/2012 | Katsunaga |
| 8,149,114 B2 | 4/2012 | Hanft |
| 8,183,995 B2 | 5/2012 | Wang et al. |
| 8,712,711 B2 * | 4/2014 | Nayar et al. ................. 702/72 |
| 2002/0019758 A1 | 2/2002 | Scarpelli |
| 2002/0171436 A1 | 11/2002 | Russell |
| 2002/0173902 A1 | 11/2002 | Haimerl et al. |
| 2002/0190525 A1 | 12/2002 | Worden et al. |
| 2003/0007369 A1 | 1/2003 | Gilbreth et al. |
| 2003/0057919 A1 | 3/2003 | Yang |
| 2004/0062059 A1 | 4/2004 | Cheng et al. |
| 2004/0262996 A1 | 12/2004 | Olsen et al. |
| 2004/0263116 A1 | 12/2004 | Doruk et al. |
| 2006/0023478 A1 | 2/2006 | Takeda et al. |
| 2006/0141093 A1 | 6/2006 | Leu |
| 2007/0005195 A1 | 1/2007 | Pasquale et al. |
| 2007/0117436 A1 | 5/2007 | Davis |
| 2007/0145952 A1 | 6/2007 | Arcena |
| 2007/0200433 A1 | 8/2007 | Kelty |
| 2008/0012667 A1 | 1/2008 | Colsch et al. |
| 2008/0141918 A1 | 6/2008 | McClintock |
| 2008/0178215 A1 | 7/2008 | Nishigaki |
| 2008/0183408 A1 | 7/2008 | Matsuura et al. |
| 2008/0272934 A1 | 11/2008 | Wang et al. |
| 2009/0102424 A1 | 4/2009 | Tien et al. |
| 2009/0146423 A1 | 6/2009 | Arinaga |
| 2009/0160259 A1 | 6/2009 | Naiknaware et al. |
| 2009/0288896 A1 | 11/2009 | Ichikawa |
| 2010/0034003 A1 | 2/2010 | Rozman et al. |
| 2010/0082464 A1 | 4/2010 | Keefe |
| 2010/0114387 A1 | 5/2010 | Chassin |
| 2010/0164473 A1 * | 7/2010 | Caird ................. 324/66 |
| 2011/0221195 A1 | 9/2011 | Raju |
| 2012/0069619 A1 | 3/2012 | Badger et al. |
| 2012/0319748 A1 | 12/2012 | Luo |
| 2013/0030588 A1 | 1/2013 | Smith et al. |

FOREIGN PATENT DOCUMENTS

| | | |
|---|---|---|
| EP | 2 475 059 A1 | 7/2012 |
| JP | 2002-305842 | 10/2002 |
| JP | 2002-305842 A | 10/2002 |
| JP | 2002305842 | 10/2002 |
| JP | 2006-141093 | 6/2006 |
| JP | 2006-141093 A | 6/2006 |
| JP | 2006-338889 | 12/2006 |
| JP | 2006-338889 A | 12/2006 |
| JP | 2006338889 | 12/2006 |
| JP | 2008-178215 | 7/2007 |
| JP | 2008-141918 | 6/2008 |
| JP | 2008-141918 A | 6/2008 |
| JP | 2008-178215 A | 7/2008 |
| TW | 200849770 A | 12/2008 |

OTHER PUBLICATIONS

Choe et al. "A Parallel Operation Algorithm with Power-Sharing Technique for FC Generation Systems". 2009.725-731.

Chenier, Glen. Reversal of Fortune. Electronic, Design, Strategy, News. 2009. p. 62.

International Search Report, PCT/US2012/071703 dated May 14, 2013.

M.A. Kai, "Lessons Learned from the Texas Synchrophasor Network", IEEE-PES Innovative Smart Grid Technologies Conference, Berlin, Oct. 14-17, 2012.

* cited by examiner

MULTIPHASE ELECTRICAL POWER PHASE IDENTIFICATION

BACKGROUND OF THE INVENTION

Traditional interconnections between energy sources or sinks for use or charging in AC power systems utilize fixed wiring connection assignments taken from multiphase generation source. Typically these connection assignments are taken through a distribution panel on a premise (i.e., business, home, or other usage location), where each phase is broken out and subsidiary wiring circuits are run utilizing one or more source phases. As a result of this break out and lack of visibility and means of allocating loads or sources, the net load/source profile in a given premise installation is usually unbalanced with an unequal amount of load on each of the phases.

Having unbalanced loads results in significant reductions in generator efficiency as well as increased losses throughout an AC transmission and distribution system. Further, if an onsite generator, especially a variable output generator such as solar or wind, is connected to the AC system, its outputs tend to be balanced from the generator but is then attached to an unbalanced loading situation in its premise. This results in the unbalanced loading on each phase of supplied power, leading to significant inefficiencies. In addition, there are a variety of voltages and wiring configurations that may be encountered in typical AC electrical hookups. Further, human error and lack of information on periodic changes made to a premise's wiring often result in the exact wiring being unknown. This problem has typically been addressed with the custom designing and tuning of power electronics to match a target or desired configuration and hard wiring the equipment to a specific identifiable set of phases. However, this approach requires multiple product designs, lower volumes of manufacture per product, and greater complexity in the design of the analog power electronics. The typical methods of identification involve significant manual labor and time to identify a specific connection in a distribution panel and verify the wiring. This identification must then be translated into a machine readable form in the equipment on site. This approach is not cost effective and is prone to error.

BRIEF SUMMARY OF THE INVENTION

According to one embodiment of the present invention, a method for multiphase electrical power phase identification, comprises: receiving a request for a power phase identification for a given power component phase connection from a power component by a monitoring component; in response to the request, sending signal characteristics for the power phase identification to the power component by the monitoring component; monitoring power signals on a plurality of distribution panel phase connections by the monitoring component; determining by the monitoring component that the signal characteristics are found on a given distribution panel phase connection; and in response to finding the signal characteristics on the given distribution panel phase connection, sending an identifier of the given distribution panel phase connection to the power component by the monitoring component.

In one aspect of the present invention, the sending of the signal characteristics for the power phase identification to the power component comprises: in response to the request, determining unique signal characteristics for the power phase identification by the monitoring component, wherein the unique signal characteristics allow a signal with the unique signal characteristics to be uniquely identifiable at the distribution panel; and sending the unique signal characteristics for the power phase identification to the power component by the monitoring component.

In one aspect of the present invention, the monitoring of power signals on the plurality of distribution panel phase connections comprises: receiving a start indication from the power component by the monitoring component; and in response to receiving the start indication, begin monitoring the power signals on the plurality of distribution panel phase connections by the monitoring component.

In one aspect of the present invention, the receiving of the start indication comprises: applying a signal with the signal characteristics on the given power component phase connection by the power component; and sending the start indication to the monitoring component by the power component.

In one aspect of the present invention, the determining that the signal characteristics are found on a given distribution panel phase connection comprises: analyzing power signals on each of the plurality of distribution panel phase connections by the monitoring component; and determining whether the signal characteristics are found on any of the plurality of distribution panel phase connections by the monitoring component.

In one aspect of the present invention, the method further comprises: in response to determining that the signal characteristics are not found on any of the plurality of distribution panel phase connections, sending an error indication to the power component by the monitoring component.

In one aspect of the present invention, the method further comprises: receiving the signal characteristics for the power phase identification from the monitoring component by the power component; selecting the given power component phase connection for the power phase identification by the power component; applying a signal with the signal characteristic on the given power component phase connection by the power component; determining whether an identifier of the given distribution panel phase connection is received from the monitoring component by the power component; and in response to receiving the identifier of the given distribution panel phase connection, associating the identifier with the given power component phase connection by the power component.

In one aspect of the present invention, the determining whether then identifier of the given distribution panel phase connection is received comprises: ceasing application of the signal with the signal characteristics on the given power component phase connection according to the signal characteristics by the power component; and sending a complete indication to the monitoring component by the power component.

System and computer program products corresponding to the above-summarized methods are also described and claimed herein.

DETAILED DESCRIPTION OF THE INVENTION

Figure 1:
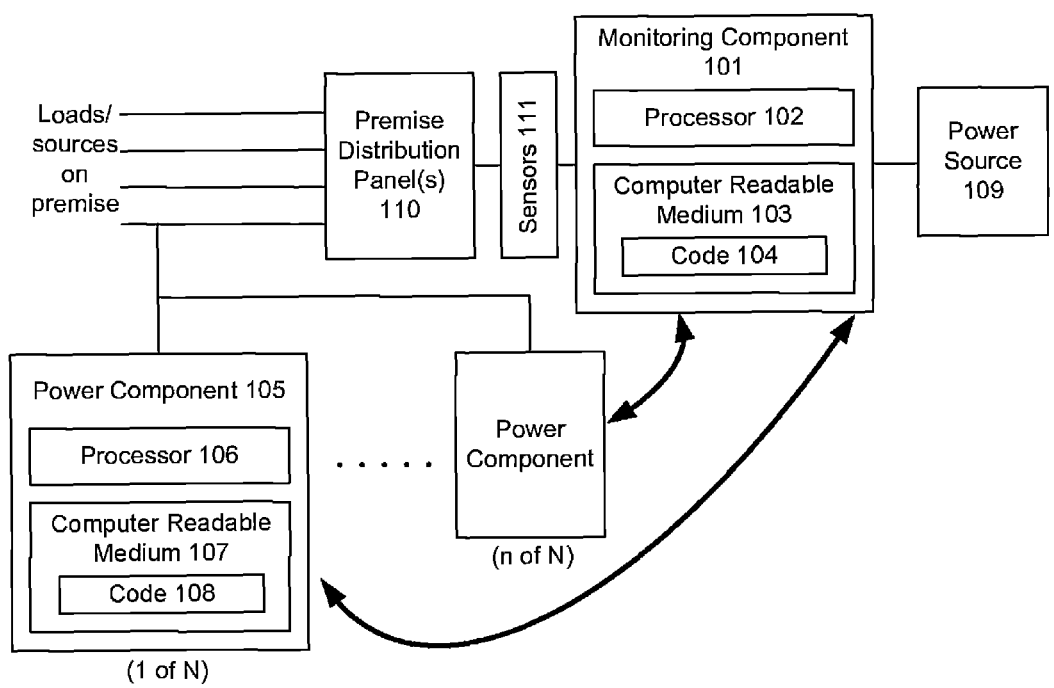
FIG. 1 illustrates an embodiment of a system for multiphase electrical power phase identification according to the present invention.

The following description is presented to enable one of ordinary skill in the art to make and use the present invention and is provided in the context of a patent application and its requirements. Various modifications to the embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention can take the form of an entirely hardware embodiment, an entirely software embodiment or an embodiment containing both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, point devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified local function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates an embodiment of a system for multiphase electrical power phase identification according to the present invention. The system comprises a premise with a power source 109 and a distribution panel 110. The system also comprises a monitoring component 101 coupled between the power source 109 and the distribution panel 110, such that any power provided by the power source 109 to the distribution panel 110 may be monitored by the monitoring component 101. One or more power components 105 reside throughout the premises and are connected via local power lines to the distribution panel 110. In this embodiment, the power components 105 can either draw power from the connections or provide power to the connections. Sensors 111 couple to the circuit connections at the distribution panel 110 and measure the voltage and current on the connections in the distribution panel 110. Each connection provides power on one of a plurality of phases of power. In this embodiment, there is one set of sensors per phase of power, and measurements by the sensors 111 are accessible to the monitoring component 101. Although the sensors 111 and the monitoring component 101 are illustrated here as separate components, the sensors 111 may be incorporated into the monitoring component 101 as well.

The monitoring component 101 further comprises a processor 102 and a computer readable medium 103. In this embodiment, the computer readable medium 103 comprises a memory (not shown) for storing program code 104. The processor 102 is able to execute the program code 104 for controlling the functions of the monitoring component 101 in implementing the method of the present invention, as described further below. Each power component 105 comprises a processor 106 and a computer readable medium 107. In this embodiment, the computer readable medium 107 comprises a memory (not shown) for storing program code 108. The processor 106 is able to execute the program code 108 for controlling the functions of the power component 105 in implementing the method of the present invention, as described further below. The monitoring component 101 communicates with each power component 105 over a twoway communications network (not shown), including but not limited to a direct wired network such as Ethernet, PowerLine Communications, or a wireless network. The processors 102 and 106 of the monitoring component 101 and power component 105, respectively, may be a microcontroller, a digital signal processor (DSP), or any other suitable processor type.

Figure 2:
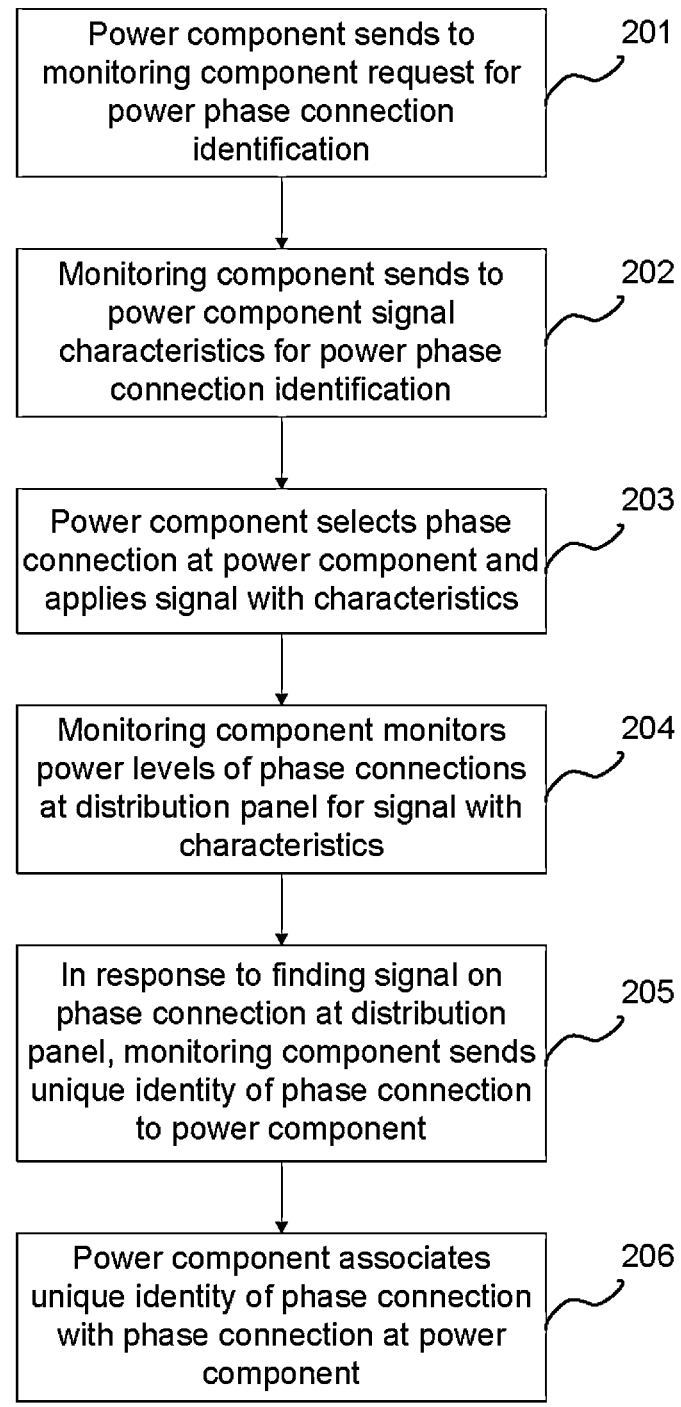
FIG. 2 is a flowchart illustrating an embodiment of a method for multiphase electrical power phase identification according to the present invention.

FIG. 2 is a flowchart illustrating an embodiment of a method for multiphase electrical power phase identification according to the present invention. Referring to both FIGS. 1 and 2, the power component 105 sends to the monitoring component 101 a request for power phase identification (201). In response to this request, the monitoring component 101 sends to the power component 105 signal characteristics for the power phase identification (202). After receiving the signal characteristics, the power component 105 selects a phase connection at the power component 105 to identify, i.e., one of a possible plurality of power circuit phases to which the power component 105 is connected. The power component 105 applies to this connection a signal with the characteristics received from the monitoring component 101 (203). For example, the signal characteristics may specify a specified frequency, power level, and duration. The power component 105 would apply a signal with the specified frequency and power level for the specified duration. The monitoring component 101 then monitors the power levels of the phase connections at the distribution panel 110 for the signal with the characteristics (204). In this embodiment, the power levels are measured by the sensors 111 coupled to the circuits at the distribution panel 110 and analyzed by the monitoring component 101. Assume here that the monitoring component 101 is able to find the signal with the characteristics on one of the phase connections at the distribution panel 110. In response, the monitoring component 101 sends a predetermined unique identity of the phase connection at the distribution panel 110 to the power component 105 (205). In response to receiving the unique identity of the phase connection at the power distribution panel 110, the power component 105 associates this unique identity with the phase connection at the power component 105 (206). In this manner, the actual phase connection between the power component 105 and the distribution panel 110 may be ascertained and stored without a need for additional hardware or precision measurements. Further, the actual phase connections may be determined remotely and need not be ascertained at the distribution panel. The signal with the characteristics may be applied by the power component for any length of time required for the signal to be identifiable without special equipment.

Figure 3:
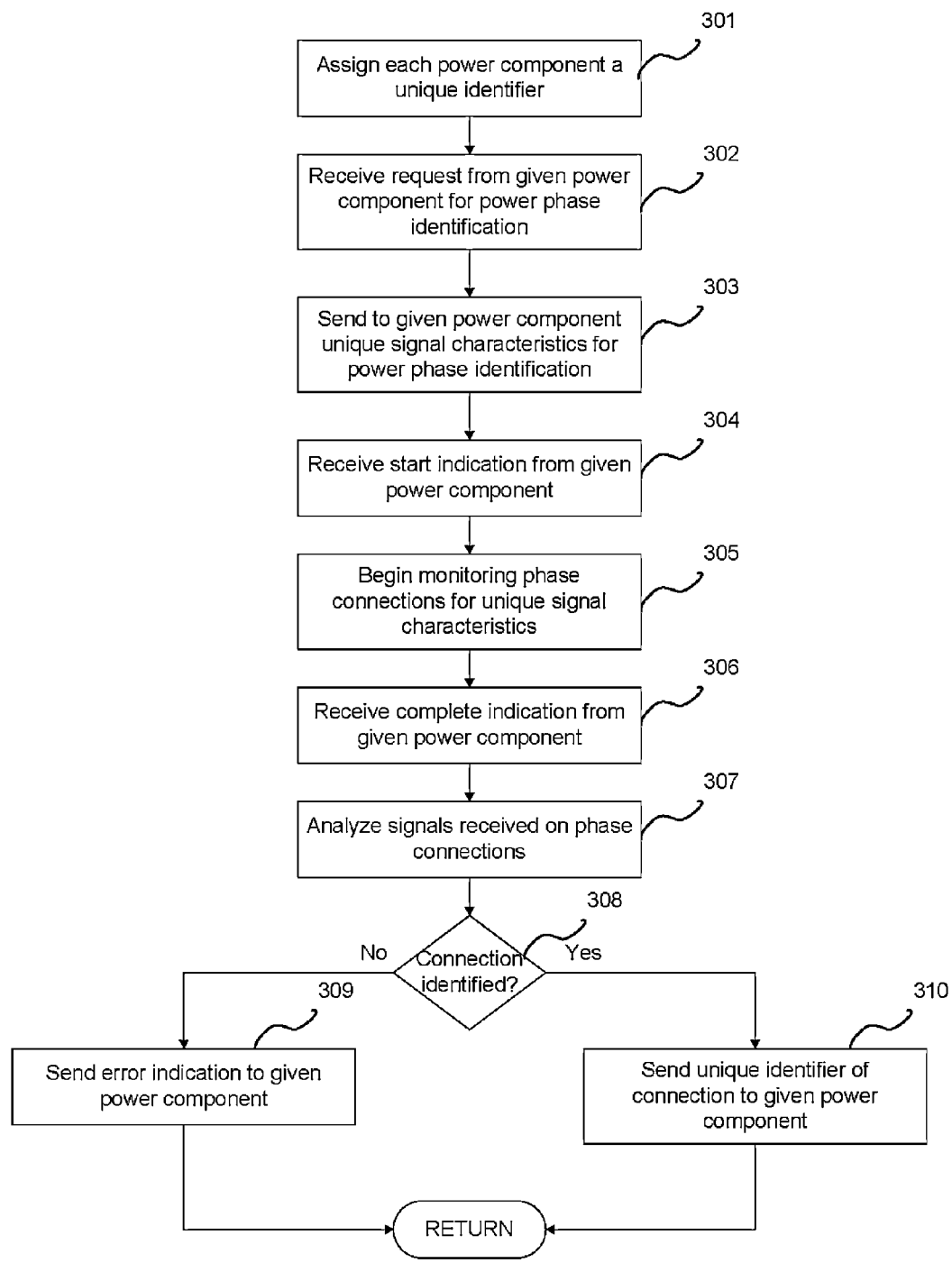
FIG. 3 is a flowchart illustrating in more detail an embodiment of the method for multiphase electrical power phase identification by the monitoring component according to the present invention.

FIG. 3 is a flowchart illustrating in more detail an embodiment of the method for multiphase electrical power phase identification by the monitoring component according to the present invention. Assuming a plurality of power components are installed on the premises, the monitoring component 101 assigns a unique identifier to each of the power components 105 (301) and establishes a data communication channel with each power component. In this embodiment, the monitoring component 101 monitors the power on each phase at the distribution panel 110 and assigns a unique identifier to each phase monitored. When the monitoring component 101 receives a request from a given power component 105 for power phase connection identification (302), the monitoring component 101 sends to the given power component 105 unique signal characteristics for the power phase identification (303). In this embodiment, the monitoring component 101 determines the unique signal characteristics based on the number of power components performing the power phase identification. The signal characteristics are chosen such that the signal used by each power component may be uniquely identifiable by the monitoring component and identifiable over the normal power signal. When the monitoring component 101 receives a start indication for the power phase identification from the given power component 105 (304), the monitoring component 101 begins monitoring the phase connections at the distribution panel 110 for the unique signal characteristics sent to the given power component 105 (305). When the monitoring component 101 receives a complete indication for the power phase identification from the given power component 105 (306), the monitoring component 101 analyzes the signals received from each of the phase connections at the distribution panel 110 via the sensors 111 to determine if any contains the signal with the specified characteristics (307). If the monitoring component 101 is able to identify a particular connection at the distribution panel 110 with a power signal containing the signal characteristics, then the monitoring component 101 sends the unique identifier of the connection to the given power component 105 (310). If the monitoring component 101 is not able to find the signal characteristics on any of the connections at the distribution panel 110, then the monitoring component 101 sends an error indication to the given power component 105 (309). The monitoring component 101 may then send a retry instruction to the given power component 105.

Figure 4:
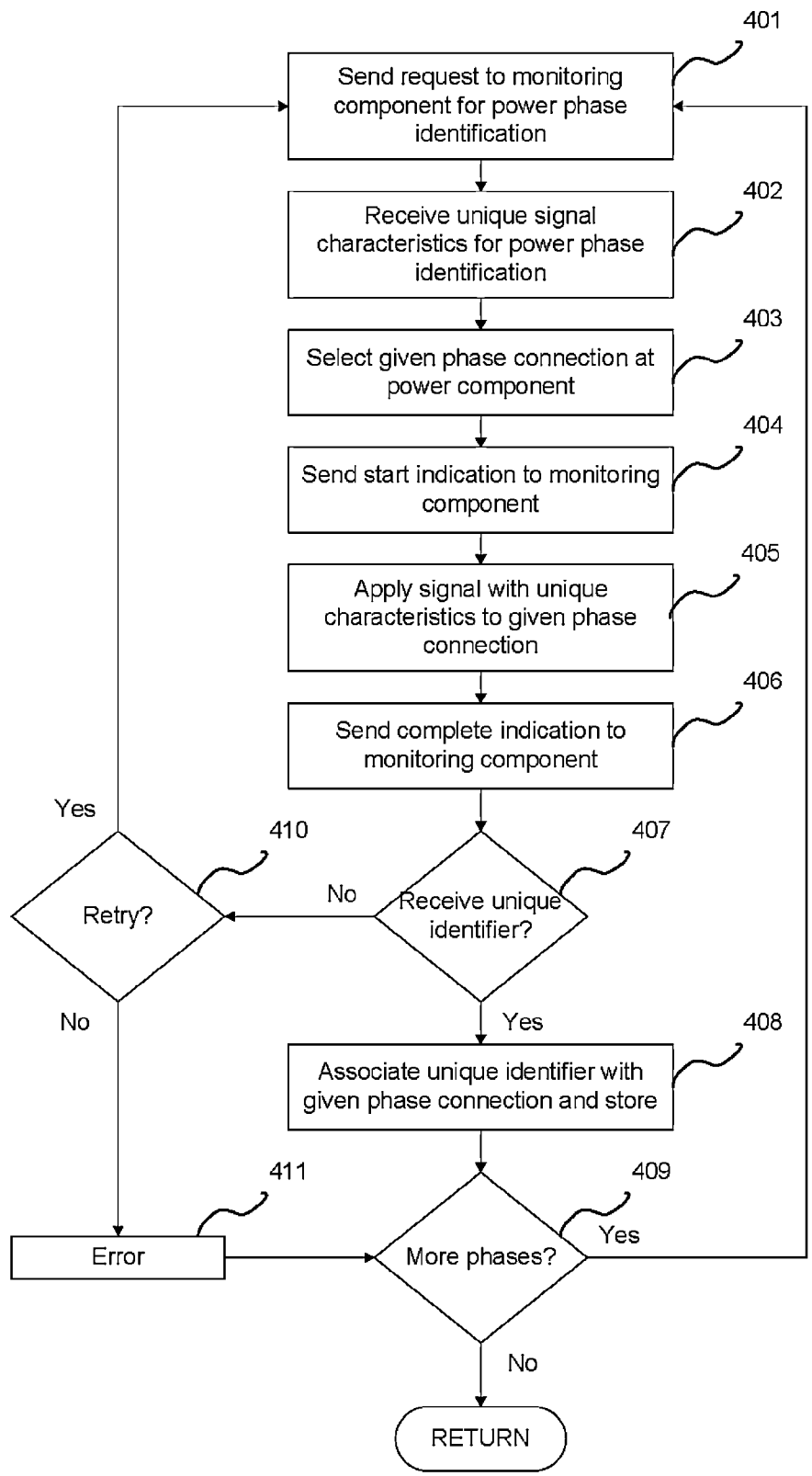
FIG. 4 is a flowchart illustrating in more detail an embodiment of the method for multiphase electrical power phase identification by the power component according to the present invention.

FIG. 4 is a flowchart illustrating in more detail an embodiment of the method for multiphase electrical power phase identification by the power component according to the present invention. Assume that a given power component 105 is connected to the local power lines and determines that it needs to identify one or more of its power phase connections. The given power component 105 contains logic that determines when the power phase identification is to be performed based upon a predetermined set of criteria. For example, the given power component 105 may determine that the power phase identification is to be performed at first power up or when its configuration changes. The given power component 105 sends a request to the monitoring component 101 for the power phase identification (401), via a data communication channel between the given power component 105 and the monitoring component 101. In response to the request, the given power component 105 receives from the monitoring component 101 unique signal characteristics to be used for the power phase identification (402). The given power component 105 selects a given phase connection from among the phase connections at the given power component 105 (403) on which to perform the power phase identification. The given power component 105 then sends a start indication to the monitoring component 101 to inform the monitoring component 101 that it is starting to apply the signal with the unique characteristics to a phase connection at the power component 105 (404). The given power component 105 then applies the signal with the unique characteristics to the given phase connection (405). For example, assume that the signal characteristics include a specific frequency, power level, and duration. The given power component 105 then applies on the given phase connection a signal with the specified frequency and power level for the specified duration. Upon the expiration of the specified duration, the given power component 105 ceases to apply the signal characteristics to the given phase connection and sends a complete indication to the monitoring component 101 (406) to inform the monitoring component 101 that the application of the signal has ceased. As described above with FIG. 3, upon receiving the start indication, the monitoring component 101 begins to monitor the phase connections at the distribution panel 110 for the unique signal characteristics. Upon receiving the complete indication, the monitoring component 101 proceeds to analyze the signals received from each of the phase connections at the distribution panel 110 via the sensors 111 to determine if any contains the signal with the specified characteristics. If the monitoring component 101 is able to identify a particular connection at the distribution panel as containing the signal characteristics, then the given power component 105 receives the unique identifier of the connection from the monitoring component 101 (407). The given power component 105 then associates the unique identifier with the given phase connection and stores the association (408). The power phase identification can be repeated for another phase connection at the given power component 105 (409). If an error indication is received from the monitoring component 101 (407), i.e., the monitoring component 101 is not able to find the signal characteristics on any of the connections at the distribution panel 110, then the given power component 105 has the option to retry the power phase identification (410). Otherwise, the power phase identification results in an error (411).

Figure 5:
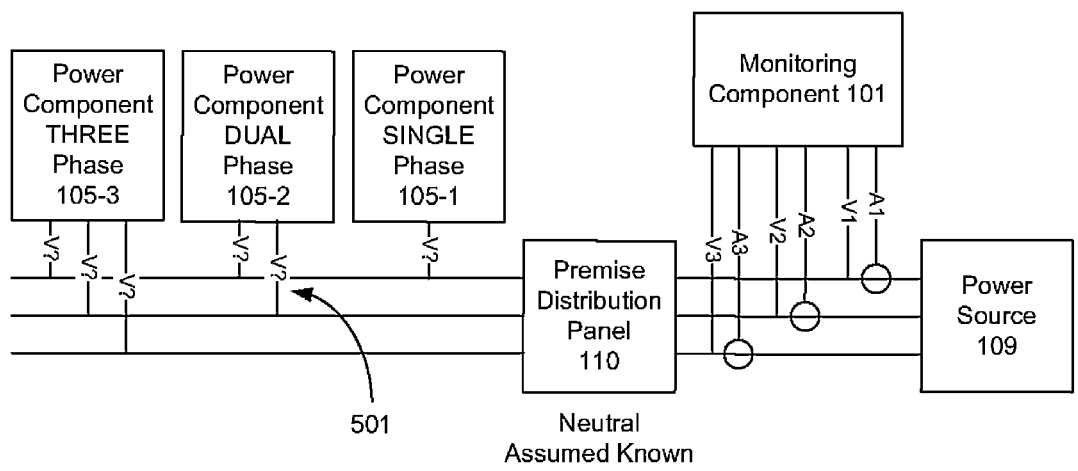
FIGS. 5 and 6 are block diagrams illustrating an example of power phase identification according to an embodiment of the present invention.
Figure 6:
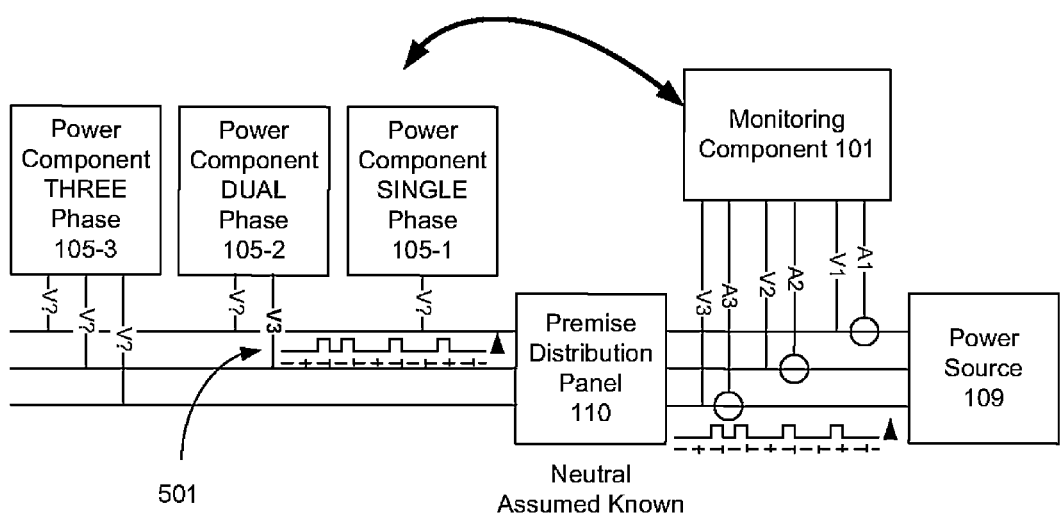

FIGS. 5 and 6 are block diagrams illustrating an example of power phase identification according to an embodiment of the present invention. Assume in this example that the monitoring component 101 is connected to incoming phases V1, V2, and V3, and assigns unique identifiers to each of the phase connections. Here, single, dual, and three phase connections are illustrated. Also assume that one or more power components (105-1 through 105-3) are each attached to one or more phases of power but without knowledge of the actual connections at the distribution panel 110. Referring now to FIGS. 3-6, each power component (105-1 through 105-3) is assigned a unique identifier by the monitoring component 101 (301). Assume that power component 105-2 sends a request to the monitoring component 101 for power phase identification (401). The monitoring component 101 receives the request from the power component 105-2 (302) and sends to the power component 105-2 unique signal characteristics for the power phase identification (303). The power component 105-2 receives the unique signal characteristics from the monitoring component 101 (402) and selects a phase connection at the power component 105-2 (403). Assume here that the phase connection 501 is selected. The power component 105-2 sends a start indication to the monitoring component 101 (404), and, as illustrated in FIG. 6, applies a signal with the unique characteristics to the phase connection 501 (405). The monitoring component 101 receives the start indication from the power component 105-2 (304) and begins monitoring all the phase connections V1-V3 for the unique signal characteristics (305). When the power component 105-2 completes the application of the signal, the power component 105-2 sends a complete indication to the monitoring component 101 (406). In response to receiving the complete indication from the power component 105-2 (306), the monitoring component 101 analyzes the signals received on the phase connections V1-V3 (307) and determines whether the unique signal characteristics were found one of the phase connections V1-V3 (308).

Figure 7:
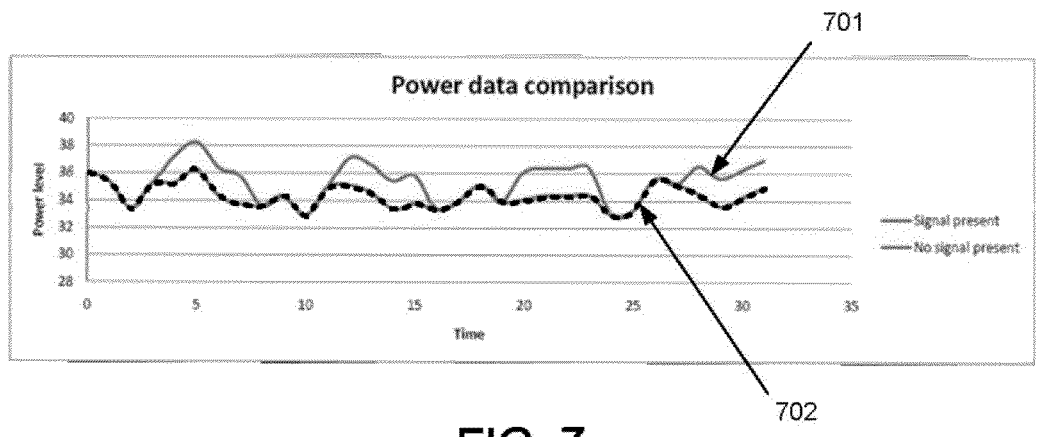
FIGS. 7 and 8 are graphs illustrating example signal characteristics that may be found on a phase connection at the monitoring component according to the present invention.
Figure 8:
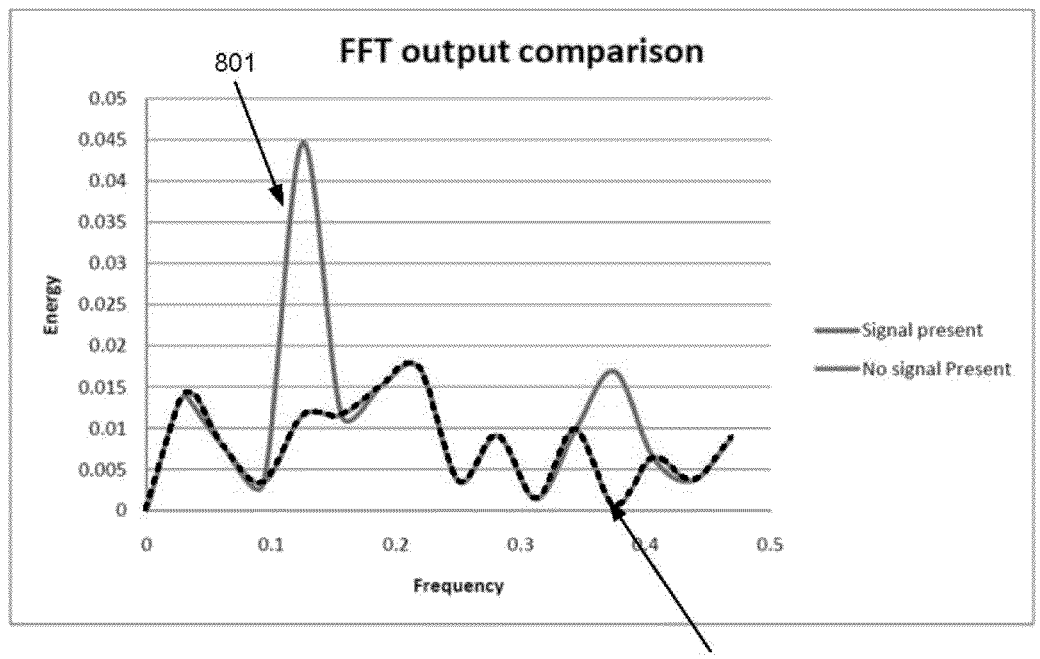

For example, FIGS. 7 and 8 are graphs illustrating example signal characteristics that may be found on a phase connection at the monitoring component according to the present invention. FIG. 7 illustrates power data measured by the sensors 111 for a 2 KW load for a 4 second on/4 second off sequence over 32 seconds. Line 702 illustrates the signal with the unique characteristics, while line 702 illustrates the normal power phase signal. FIG. 8 illustrates a fast Fourier transform (FFT) output comparison of the power data. Line 801 illustrates the FFT output signal with the unique characteristics, while line 802 illustrates the normal FFT output signal.

As illustrated in FIGS. 7 and 8, the signal with the unique characteristics is such that it is identifiable over the normal power phase signal.

Returning to FIGS. 3-6, assume that the monitoring component 101 finds the unique signal characteristics on the phase connection V3. In response, the monitoring component 101 sends the unique identifier of the phase connection V3 to the power component 105-2 (310). Upon receiving the unique identifier V3 from the monitoring component 101 (407), the power component 105-2 associates the unique identifier V3 with the phase connection 501 and stores the association (408). The above process may be repeated for other phases (409).

A method and system for multiphase electrical power phase identification have been disclosed. The embodiments according to the present invention provide for the identification of the relationship between a given power connection by phase at a power component with the circuit connection at the distribution panel of a premise. The embodiments according to the present invention comprise a monitoring component operationally coupled to one or more power components. The power components place defined sequences of load and source onto a given phase in such a fashion as to facilitate the identification of the phase in a power connection at the distribution panel by the monitoring component. The embodiments of the present invention allows for more effective management and balance of power use among the power components.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for multiphase electrical power phase identification, comprising:
   (a) receiving a request for a power phase identification for a given power component phase connection from a power component by a monitoring component;
   (b) in response to the request, sending signal characteristics for the power phase identification to the power component by the monitoring component;
   (c) monitoring power signals on a plurality of distribution panel phase connections by the monitoring component;
   (d) determining by the monitoring component that the signal characteristics are found on a given distribution panel phase connection; and
   (e) in response to finding the signal characteristics on the given distribution panel phase connection, sending an identifier of the given distribution panel phase connection to the power component by the monitoring component.

2. The method of claim 1, wherein the sending (b) comprises:
   (b1) in response to the request, determining unique signal characteristics for the power phase identification by the monitoring component, wherein the unique signal characteristics allow a signal with the unique signal characteristics to be uniquely identifiable at the distribution panel; and
   (b2) sending the unique signal characteristics for the power phase identification to the power component by the monitoring component.

3. The method of claim 1, wherein the monitoring (c) comprises:
(c1) receiving a start indication from the power component by the monitoring component; and
(c2) in response to receiving the start indication, begin monitoring the power signals on the plurality of distribution panel phase connections by the monitoring component.

4. The method of claim 3, wherein the receiving (c1) comprises:
(c1i) applying a signal with the signal characteristics on the given power component phase connection by the power component; and
(c1ii) sending the start indication to the monitoring component by the power component.

5. The method of claim 1, wherein the determining (d) comprises:
(d1) analyzing power signals on each of the plurality of distribution panel phase connections by the monitoring component; and
(d2) determining whether the signal characteristics are found on any of the plurality of distribution panel phase connections by the monitoring component.

6. The method of claim 5, wherein the method further comprises:
(f) in response to determining that the signal characteristics are not found on any of the plurality of distribution panel phase connections, sending an error indication to the power component by the monitoring component.

7. The method of claim 1, further comprising:
(f) receiving the signal characteristics for the power phase identification from the monitoring component by the power component;
(g) selecting the given power component phase connection for the power phase identification by the power component;
(h) applying a signal with the signal characteristics on the given power component phase connection by the power component;
(i) determining whether an identifier of the given distribution panel phase connection is received from the monitoring component by the power component; and
(j) in response to receiving the identifier of the given distribution panel phase connection, associating the identifier with the given power component phase connection by the power component.

8. The method of claim 7, wherein the determining (i) comprises:
(i1) ceasing application of the signal with the signal characteristics on the given power component phase connection according to the signal characteristics by the power component; and
(i2) sending a complete indication to the monitoring component by the power component.

9. A system, comprising:
a monitoring component comprising:
a processor; and
a computer readable medium comprising a memory, the memory comprising computer readable program code for multiphase electrical power phase identification, wherein the computer readable program code when executed by the processor causes the monitoring component to:
receive a request for a power phase identification for a given power component phase connection from a power component;
in response to the request, send signal characteristics for the power phase identification to the power component;
monitor power signals on a plurality of distribution panel phase connections;
determine that the signal characteristics are found on a given distribution panel phase connection; and
in response to finding the signal characteristics on the given distribution panel phase connection, send an identifier of the given distribution panel phase connection to the power component.

10. The system of claim 9, wherein the sending of the identifier of the given distribution panel phase connection comprises:
in response to the request, determine unique signal characteristics for the power phase identification, wherein the unique signal characteristics allow a signal with the unique signal characteristics to be uniquely identifiable at the distribution panel; and
send the unique signal characteristics for the power phase identification to the power component.

11. The system of claim 9, wherein the monitoring of the power signals on the plurality of distribution panel phase connections comprises:
receive a start indication from the power component; and
in response to receiving the start indication, begin to monitor the power signals on the plurality of distribution panel phase connections.

12. The system method of claim 11, further comprising the power component, wherein the power component:
applies a signal with the signal characteristics on the given power component phase connection; and
sends the start indication to the monitoring component.

13. The system of claim 9, wherein the determining that the signal characteristics are found on the given distribution panel phase connection comprises:
analyze power signals on each of the plurality of distribution panel phase connections; and
determine whether the signal characteristics are found on any of the plurality of distribution panel phase connections.

14. The system of claim 13, wherein the computer readable program code when executed by the processor further causes the monitoring component to:
in response to determining that the signal characteristics are not found on any of the plurality of distribution panel phase connections, send an error indication to the power component by the monitoring component.

15. The system of claim 9, further comprising the power component, wherein the power component:
receives the signal characteristics for the power phase identification from the monitoring component;
selects the given power component phase connection for the power phase identification;
applies a signal with the signal characteristic on the given power component phase connection;
determines whether an identifier of the given distribution panel phase connection is received from the monitoring component; and
in response to receiving the identifier of the given distribution panel phase connection, associates the identifier with the given power component phase connection.

16. The system of claim 15, wherein the determining of whether the identifier of the given distribution panel phase connection is received from the monitoring component comprises:

ceases application of the signal with the signal characteristics on the given power component phase connection according to the signal characteristics; and sends a complete indication to the monitoring component.

17. A computer program product comprising a computer readable medium having a memory, the memory having a computer readable program, wherein the computer readable program when executed on a computer causes the computer to:

receive a request for a power phase identification for a given power component phase connection from a power component;

in response to the request, send signal characteristics for the power phase identification to the power component;

monitor power signals on a plurality of distribution panel phase connections;

determine that the signal characteristics are found on a given distribution panel phase connection; and in response to finding the signal characteristics on the given distribution panel phase connection, send an identifier of the given distribution panel phase connection to the power component.

18. The computer program product of claim 17, wherein the computer readable program code to send the identifier of the given distribution panel phase connection further causes the computer to:

in response to the request, determine unique signal characteristics for the power phase identification, wherein the unique signal characteristics allow a signal with the unique signal characteristics to be uniquely identifiable at the distribution panel; and send the unique signal characteristics for the power phase identification to the power component.

19. The computer program product of claim 18, wherein the computer readable program code to determine that the signal characteristics are found on the given distribution panel phase connection further causes the computer to:

analyze power signals on each of the plurality of distribution panel phase connections; and determine whether the signal characteristics are found on any of the plurality of distribution panel phase connections.

20. The computer program product of claim 17, wherein the computer readable program code to monitor the power signals on the plurality of distribution panel phase connections further causes the computer to:

receive a start indication from the power component; and in response to receiving the start indication, begin to monitor the power signals on the plurality of distribution panel phase connections.

* * * * *